(12) United States Patent
Carter et al.

(10) Patent No.: US 8,023,307 B1
(45) Date of Patent: Sep. 20, 2011

(54) PERIPHERAL SIGNAL HANDLING IN EXTENSIBLE THREE DIMENSIONAL CIRCUITS

(75) Inventors: Richard J. Carter, Los Altos, CA (US); Frederic Amerson, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 25 days.

(21) Appl. No.: 12/771,158

(22) Filed: Apr. 30, 2010

(51) Int. Cl.
*G11C 11/00* (2006.01)
(52) U.S. Cl. .............. 365/130; 365/225; 365/185.23; 365/69; 365/185.09
(58) Field of Classification Search .............. 365/130, 365/225, 185.23, 69, 185.09
See application file for complete search history.

(56) References Cited

U.S. PATENT DOCUMENTS

| | | | |
|---|---|---|---|
| 6,434,048 B1 * | 8/2002 | Tran et al. ............. | 365/185.19 |
| 6,504,742 B1 | 1/2003 | Tran et al. | |
| 6,765,813 B2 | 7/2004 | Scheuerlein et al. | |
| 7,233,024 B2 | 6/2007 | Scheuerlein et al. | |
| 7,629,253 B2 | 12/2009 | Tanaka | |
| 2008/0130342 A1 | 6/2008 | Zhang | |
| 2008/0310207 A1 | 12/2008 | Tan et al. | |

* cited by examiner

*Primary Examiner* — Jason Lappas

(57) ABSTRACT

A method for handling peripheral signals in an extensible three dimensional circuit includes forming an extensible three dimensional circuit with a plurality of stacked crossbar arrays and at least one class of traveling lines which travel vertically and laterally through the circuit. The method also includes alternating the traveling direction of bundles of traveling lines such that there are a substantially equal number of undriven lines and underutilized lines which exit out of a given side of the circuit and creating loopback traces which connect the undriven traveling lines and the underutilized traveling lines to form driven traveling lines with a full complement of memory elements and eliminate addressing gaps within the circuit.

15 Claims, 16 Drawing Sheets

1600

Form an extensible three dimensional circuit with a plurality of stacked crossbar arrays and at least one class of traveling lines which travel vertically and laterally through the circuit
(step 1610)

Alternate the traveling direction of bundles of traveling lines such that there are a substantially equal number of undriven lines and underutilized lines which exit out of a given side of the circuit
(step 1620)

Create loopback traces which connect the undriven lines and the underutilized lines to form driven lines with a full complement of memory elements and eliminate addressing gaps within the circuit
(step 1630)

Analyze the circuit to determine if redundant addressing of memory elements occurs
(step 1640)

If redundant interconnections occur, alter the interconnection scheme so that the traveling row and traveling column lines are in vertically separate crossbar arrays when the traveling row and traveling column lines cross for a second time.
(step 1650)

*Fig. 16*

PERIPHERAL SIGNAL HANDLING IN EXTENSIBLE THREE DIMENSIONAL CIRCUITS

STATEMENT OF GOVERNMENT INTEREST

This invention has been made with government support under Contract No. HR001 1-09-3-000 1, awarded by the Defense Advanced Research Project Agency. The government has certain rights in the invention.

BACKGROUND

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry. A significant challenge in creating three dimensional circuits is peripheral signal handling.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIG. 16 is a flow chart of an illustrative method for handling peripheral signals of a three dimensional memory circuit to minimize capacity loss and irregular via utilization, according to one embodiment of principles described herein.

Throughout the drawings, identical reference numbers designate similar, but not necessarily identical, elements.

DETAILED DESCRIPTION

The principles described below can be applied to a wide variety of circuits. For purposes of explanation, a three dimensional memory circuit is assumed with area-distributed vias driven from an active circuit layer connecting to a first of multiple crossbar memory array layers. To allow for unique memory element addressing, some vias must connect to wires that travel away from their original active-layer connection point as they move up the stack of memory array layers. These traveling wires, in a regular memory design, will generally emerge from, or need to be sourced into, the memory circuit periphery of the memory array layers. This may cause a number of undesirable edge effects, including loss of full memory capacity and irregular via utilization. According to one illustrative embodiment, the memory circuit is rearranged so that any side that has traveling wires that need to be sourced into it, also has traveling wires that emerge from it. Then, the traveling wires that emerge from the periphery are connected back into the wires that need to be sourced into the periphery in a manner that mitigates the undesirable edge effects.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Figure 1:
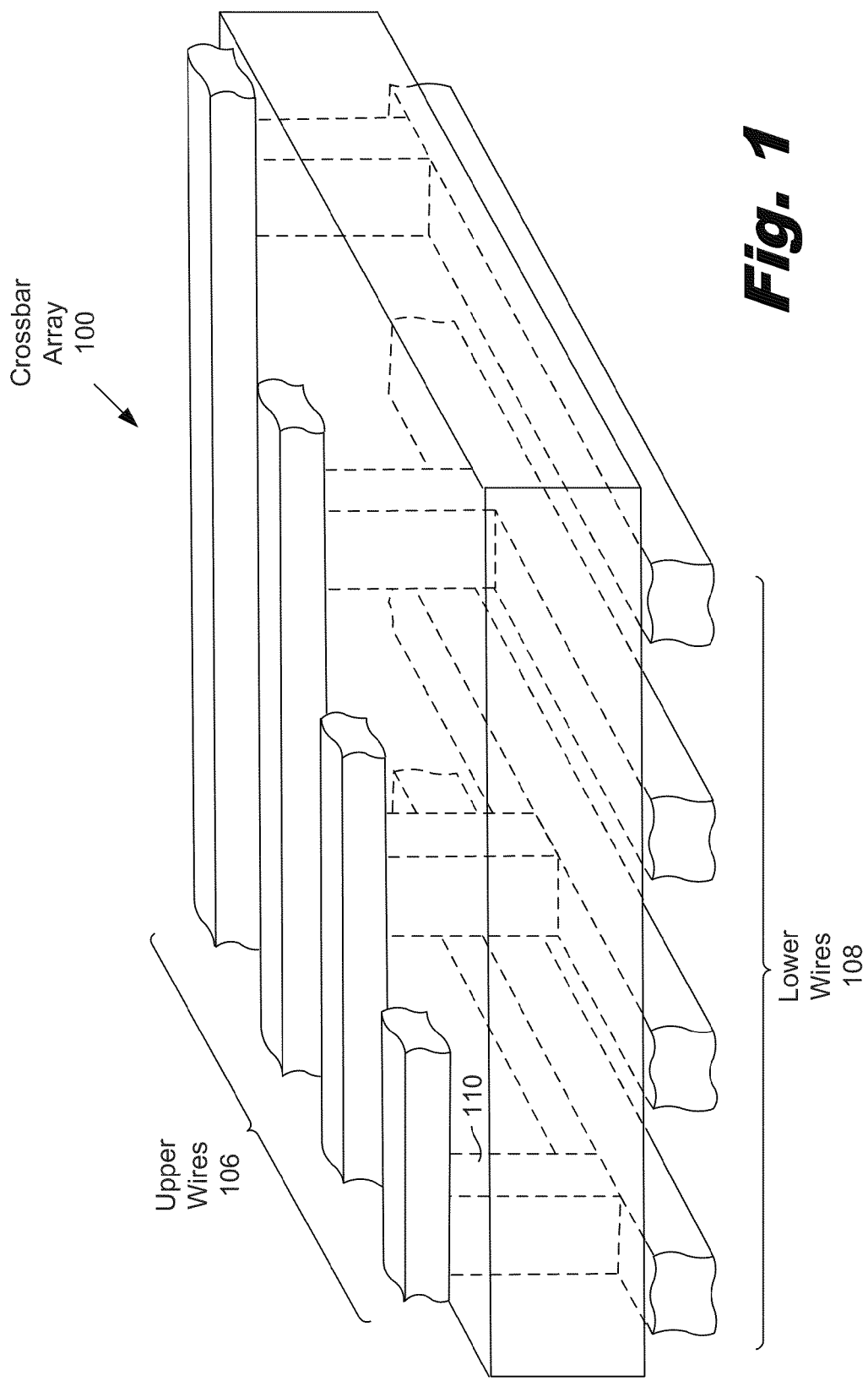
FIG. 1 is a perspective view of an illustrative crossbar array, according to one embodiment of principles described herein.

FIG. 1 is a diagram of an illustrative crossbar array (100). The crossbar array (100) includes upper crossbar wires (106) which are generally parallel. In this illustrative embodiment, a second group of lower crossbar wires (108) are substantially perpendicular to and cross the first group of lines (106).

According to one illustrative embodiment, programmable crosspoint devices (110) are formed between crossing lines. The programmable crosspoint devices (110) may be configured in a variety of ways. For example, the programmable crosspoint devices (110) may be configured as programmable fuses or as part of a neural network. In some embodiments, the programmable crosspoint devices (110) may be configured as memory elements. The crossbar array (100) may include a variety of different types of programmable crosspoint devices (110) to accomplish its function. For example, a crossbar architecture can be used to form implication logic structures and crossbar based adaptive circuits such as artificial neural networks. The crossbar array (100), with its higher planar device density, has several advantages over conventional circuitry including higher capacity and/or smaller planar area.

As used in the specification and appended claims, a crossbar array includes a set of upper crossbar wires, a set of lower crossbar wires which cross the upper crossbar wires at a non-zero angle, and programmable crosspoint devices interposed between the wires at the crossing points.

According to one illustrative embodiment, the programmable crosspoint devices (110) are memristive devices. Memristive devices are described in U.S. Patent App. Pub. No. 2008/0079029, entitled "Multi-terminal Electrically Actuated Switch" and U.S. Patent App. Pub. No. 2008/009033, entitled "Electrically Actuated Switch", both to R. Stanley Williams, which are hereby incorporated in their entirety. Additionally or alternatively, the programmable crosspoint devices (110) may include memcapacitive devices. Various illustrative embodiments of memcapacitive devices are described in PCT Application No. PCT/US2009/047164 to Dmitri Strukov et al., entitled "Capacitive Crossbar Arrays" filed Jun. 12, 2009, which is incorporated by reference in its entirety.

Throughout the specifications and appended claims, the term "programmable crosspoint device" refers to a broad family of devices or technologies which provide the ability to program and sense state changes in devices which are interposed between crossing conductive elements. The term "memristive device" or "memristor" refers to a specific type of programmable crosspoint device which uses dopant motion within a matrix to alter the resistive state of the device.

Memristive devices exhibit a "memory" of past electrical conditions. For example, a memristive device may include a matrix material which contains mobile dopants. These dopants can be moved within a matrix to dynamically alter the electrical operation of an electrical device. The motion of dopants can be induced by the application of a programming electrical voltage across a suitable matrix. The programming voltage generates a relatively high electrical field through the memristive matrix and alters the distribution of dopants within the matrix. After removal of the electrical field, the location and characteristics of the dopants remain stable until the application of another programming electrical field. These changing dopant configurations within a matrix produce changes in the electrical resistance or other characteristics of the device.

The memristive device can be read by applying a lower reading voltage which allows the internal electrical resistance of the memristive device to be sensed but does not generate a high enough electrical field to cause significant dopant motion. According to one illustrative embodiment, the memristive device exhibits a rectifying behavior similar to Schottky diode. The state of the memristive device can be read by applying a full forward voltage bias across a specified junction while reverse biasing other memristive devices in the array to suppress leakage currents.

Each of the memristive crosspoint devices (110) may be used to represent one or more bits of data. For example, in the simplest case, memristive crosspoint devices (110) may have two states: a conductive state and a nonconductive state. The conductive state may represent a binary "1" and the nonconductive state may represent a binary "0", or vice versa. Binary data can be written into the crossbar array (100) by changing the conductive state of the memristive crosspoint devices (110). The binary data can then be retrieved by sensing the state of the memristive crosspoint devices (110). Additionally or alternatively, the crossbar array (100) can incorporate memristive crosspoint devices (110) which have more than two states.

There are a wide variety of interconnection architectures which can incorporate the illustrative principles described below. For example, PCT Application No. PCT/US2009/039666, to Dmitri Strukov et al., entitled "Three Dimensional Multilayer Circuit," filed Apr. 6, 2009, describes various three dimensional interconnection schemes and is incorporated by reference in its entirety. Additionally, various illustrative applications and examples of multilayer circuits which incorporate crossbar interconnections are given in "Nano/CMOS architectures using a field-programmable nanowire interconnect", Gregory Snider et al., Nanotechnology 18, 035204 (2007) which is incorporated by reference herein in its entirety.

Throughout the specification and appended claims, the cardinal directions (north, south, east, west) are used to indicate directionality. "North" is used to indicate a direction or location which is upward on the page; "south" is used to indicate a direction which is downward on the page; "east" is used to indicate a direction which is to the right on the page; and "west" is used to indicate a direction which is to the left on the page. These descriptions of directionality are used for purposes of description and do not limit the structures to specific orientations.

Figure 2:
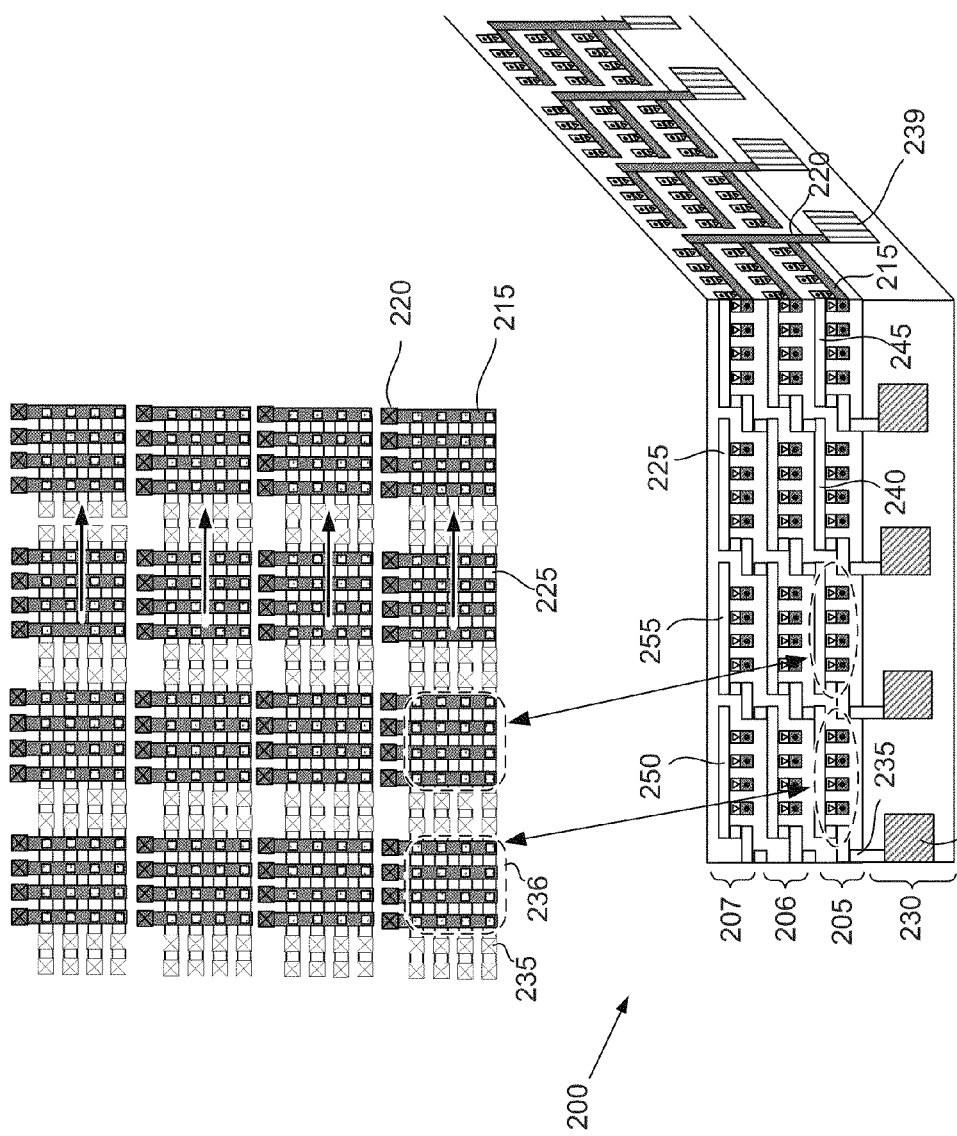
FIG. 2 is a diagram of an illustrative extensible three dimensional circuit having undriven lines and underutilized lines, according to one embodiment of principles described herein.

FIG. 2 includes a plan view of a first crossbar array layer (205) and cross-sectional view of an illustrative extensible three dimensional memory circuit (200). The cross-sectional view shows an access layer (230) which contains a number of access gates (237, 239). The access layer (230) may be based on a variety of technologies, including complementary metal-oxide-semiconductor (CMOS) or other conventional computer circuitry. This CMOS circuitry can provide additional functionality to the memristive device such as input/output functions, buffering, logic, or other functionality. In addition to the area distributed configuration illustrated in FIG. 2, the principles described could also be applied to access layers with peripherally distributed access devices. Overlying the access layer are multiple crossbar array layers. A crossbar array layer includes two classes of parallel control lines that cross each other, with programmable crosspoint devices formed where pairs of control lines cross. To distinguish the two control line classes, they will be termed "row lines" and "column lines."

Connections are made between the access gates (237, 239) in the access layer (230) and the overlying crossbar array layer (205) by vertical vias (235, 220). In the illustrative three dimensional circuit shown in FIG. 2, there are three crossbar array layers (205, 206, 207) stacked vertically on top of each other. In this illustrative memory circuit (200), a specific memory element is either read or written by energizing a unique row-line and column-line pair. As the number of array layers in a multi-layer memory array increases, a row line from a given row via will need to be connected to an everincreasing number of memory elements. Each of these memory elements must be connected to a unique column line and via. Since there are a limited number of column vias within a certain distance of a given row via, as the number of array layers is increased, the row line must necessarily travel farther and farther away from its original connection point to the active circuitry layer.

In the specification and appended claims, the term "pillar lines" refers to lines or groups of lines which travel vertically, but not laterally through a three dimensional circuit except through stubs that are each a fraction of the full line length. Pillar lines maintain the same vertical via footprint in all layers. The term "travelling lines" refers to lines or groups of lines which move both vertically and laterally through a three dimensional circuit. Additionally, there are two classes of lines within the circuit: shaded row lines and unshaded column lines. The designation of row and column lines is arbitrary and is used for convenience of explanation. In this example, the row lines (215) are oriented north/south in the circuit (200) and the column lines (225, 240, 245, 250, 255) are oriented east/west in the circuit (200). For example, a first column line (225) is attached to column access gate (237) by column via (235). The first column line (225) then travels to the east and crosses a number of row lines (215) in the first crossbar array layer (205). At these crossings, a number of programmable crosspoint devices, which by example will be termed memristors, are shown. The column line (225) then steps upward and to the east to cross with a different set of row lines (215) in the second crossbar array layer (206), forming additional memristors. The column line (225) makes a final step upward to the uppermost crossbar array layer (207) in the circuit and addresses four more memristors in combination with four additional row lines (215). Consequently, in this illustrative embodiment, a column line with a full complement of memristors can be used to address 12 memristors. The number of layers, the number of memristors, and the scale of the drawing have been selected for purposes illustration. The scale, size, and number of components within an actual circuit could vary significantly from the diagrams.

The plan view of the circuit shows one crossbar array within the circuit (200). The crossbar array shows a number of "mini-grids" (236) which are created by crossing groups of row lines (215) and column lines (225). These mini-grids (236) can be tiled together to form the crossbar array layer (205). In this illustrative embodiment, the column lines (225) travel to the east as they move upward through the circuit. The traveling column lines will generally emerge from, or need to be sourced into, the memory circuit periphery of the memory array layers. This causes problems, including loss of full memory capacity and irregular via utilization. For example, column lines (250, 255) in the upper left portion of the cross sectional diagram are "undriven" because they are not attached to access gates. Consequently, memristors which are connected to these undriven column lines (250,255) are not accessible. Further, because the undriven lines (250, 255) are not attached to access gates, the voltages on the undriven lines (250, 255) may float at uncontrolled levels. This can interfere with the operation of other portions of the circuit.

On the east edge of the circuit (200) there are a number of traveling lines (240, 245) which terminate at the edge before they have connected with a full complement of memristors. These traveling lines (240, 245) are called underutilized lines. The first underutilized line (240) is connected to only 8 memristors and the second underutilized line (245) is connected to only 4 memristors. The underutilized lines (240, 245) may cause a number of issues within the memory architecture. For example, the underutilized lines (240, 250) disrupt the uniformity of the addressing scheme within the circuit (200). Assume for the moment that the example circuit (200) had 4 layers and the full complement of memory elements on a column line was 16. It would be natural then to address this 256*4=1024 bit memory with a 10-bit address. Perhaps the most-significant 6 bits could be used to select one of the 64 column vias, and the remaining 4 bits used to select 1 of the 16 memory elements on the column line. Having column lines that possess less than this full complement of 16 memory elements makes such a natural addressing scheme impossible. A pragmatic approach would dictate that column vias without the full complement of memory elements would not be used, i.e. their capacity would be discarded.

Further, the underutilized lines have different electrical characteristics than other lines. For example, the resistance, capacitance, and current draw of the underutilized lines (240, 250) may be different than lines with a full length and full complement of memristors. These differences may cause problems within the circuit because the access gates and other supporting circuitry may be specifically tuned to drive lines with a full complement of memristors.

To summarize, traveling row or column lines are a necessity of extensible stacked memory array circuits with a given number of row and column vias, coupled with the requirement for unique memory element addressing. These traveling lines, given a regular patterning of the memory array layers, will produce both undriven and incompletely utilized row (or column) lines, which hurts capacity and presents system issues for the regular addressing of the available memory elements. This capacity loss grows proportionally as the square of the number of crossbar layers.

Figure 3:
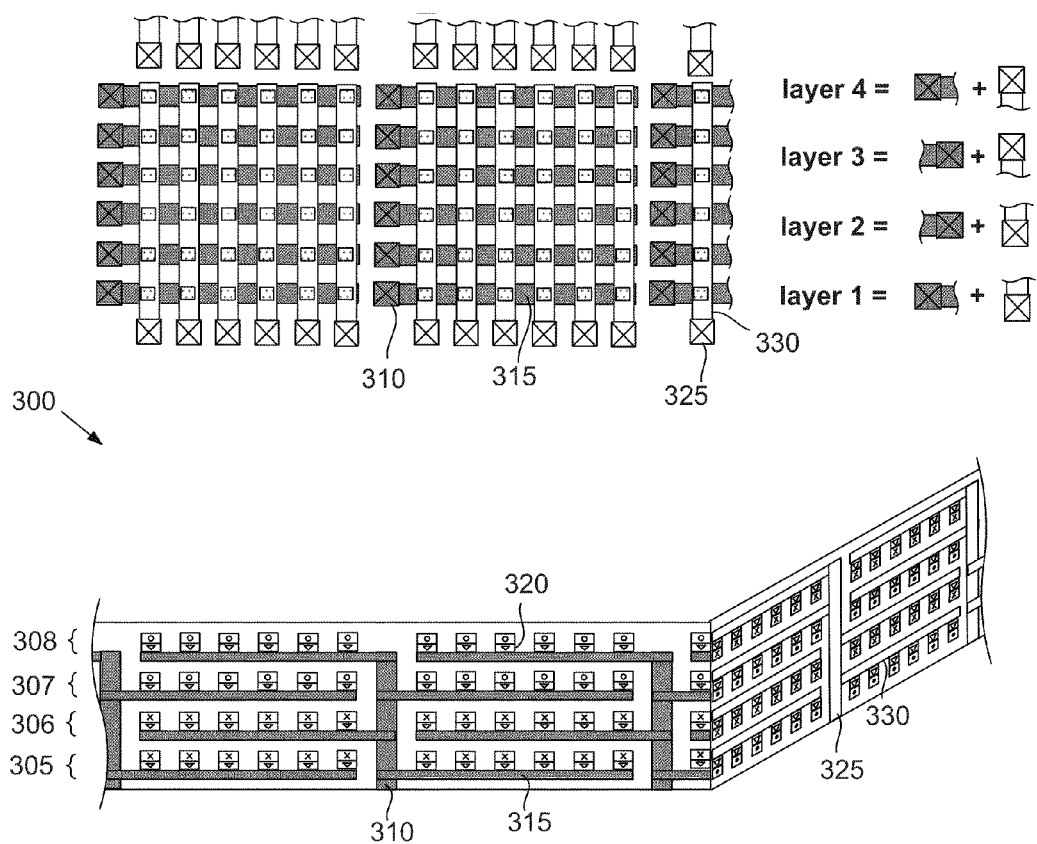
FIG. 3 is a diagram of an illustrative non-extensible four layer memory array without undesirable edge effects.

There are a number of potential solutions to the problem of underutilized and undriven lines at the periphery of the circuit. For example, one solution to the problem of traveling row or column lines is, quite simply, not to have the lines travel. FIG. 3 illustrates a multilayer circuit (300) which is constructed without traveling lines. In this illustrative embodiment of one solution, both row lines (315) and column lines (330) are in the pillar configuration. Rather than travel, the row and column lines (315, 300) extend laterally outward from pillar vias (310, 325) in each in two different directions. The unique combinations of row and column lines in each crossbar layer allow the memory elements (320) to be uniquely addressed in the four crossbar layers (305-308). However, circuits without traveling lines are necessarily limited in the number of layers that can be uniquely addressed. Consequently, circuits without traveling lines may not be extensible to the same degree as circuit with traveling lines.

Another solution is to just tolerate the capacity loss associated with traveling lines. Some peripheral portion of the chip footprint is patterned with incompletely utilized circuitry. Undriven row lines must still be provided for if having them float disrupts the operation of the usable portion of the memory.

Another solution may be to provide special vias at the periphery of the chip to drive the otherwise-undriven row (or column) lines. Some periphery row lines would still be underutilized, but a complicated manipulation of the memory address could potentially piece together these regions of the memory into a fully-populated address space amenable for system use. All of these solutions significantly increase the complexity of the design and/or compromise the utility of the circuit.

However, the Applicant has discovered a method of handling these edge effects which maintains both the uniform addressability within the circuit and the extensibility of the circuit. As discussed above, traveling lines can create a number of undesirable edge effects, including undriven and underutilized lines. According to one illustrative embodiment, a first principle of handling edge effects is for bundles of traveling lines to go in both directions in equal numbers, so that the number of undriven lines that need to be sourced into a given side of the circuit equals the number of traveling lines that emerge from that side.

Figure 4:
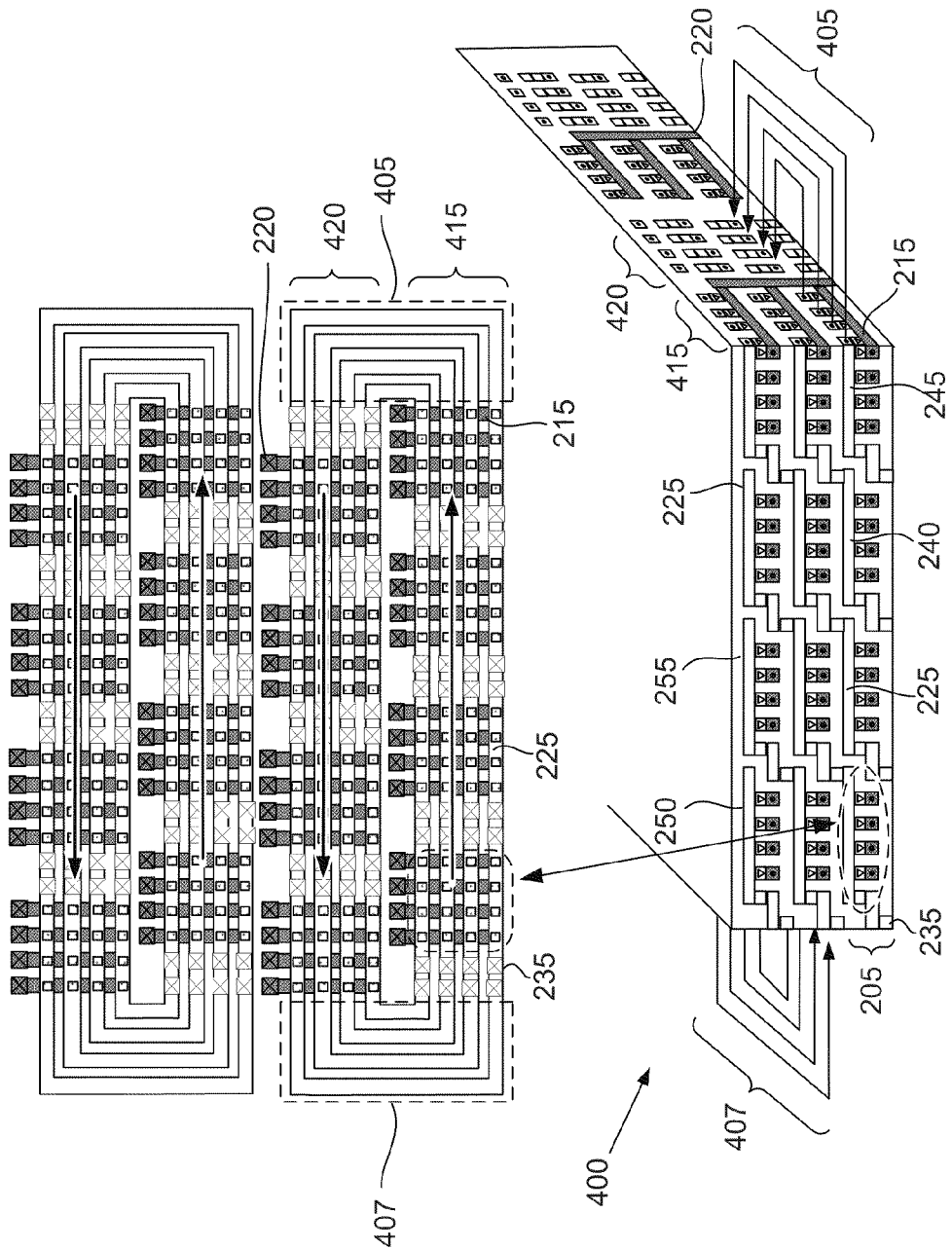
FIG. 4 is a diagram of an illustrative extensible three dimensional circuit in which bundles of traveling lines move in both directions and are connected by loopback traces, according to one embodiment of principles described herein.

FIG. 4 shows a plan view and a cross-sectional view of an illustrative three dimensional circuit (400) which resolves the edge effects according to the principles described above to achieve a fully populated address space and does not limit the extensibility of the circuit. The circuit (400) is similar to the circuit (200) illustrated in FIG. 2 in that it contains three crossbar layers (205, 206, 207) and has traveling column lines (225) which are interconnected by column vias (235). The row lines (215) have a pillar configuration and are interconnected by row vias (220). However, this illustrative circuit (400) has been rearranged so that bundles of traveling column lines (225) go in both directions. As shown by the solid black arrows in the plan view, a first bundle (415) of traveling lines travels from west to east and a second bundle (420) of traveling lines travels east to west. This provides a number of underutilized lines (240, 245) in the first bundle (415) which emerge on the east of the circuit and an adjacent equal number of undriven lines in the second bundle of lines (420). The underutilized lines (240, 245) in the first bundle (415) can then be connected to the undriven lines in the second bundle (420) by loopback traces such as loopback traces (405). This resolves the edge effects and provides each line with connection to the underlying access gates and a full complement of memristors.

A similar technique can be used to connect the underutilized and undriven lines emerging from the west side of the circuit (400). Specifically, underutilized lines from the second bundle (420) emerge on the west side of the circuit. Lookback traces such as loopback traces (407) connect these underutilized lines to undriven lines (250, 255) in the first bundle (415). Similar loopback traces connect other underutilized lines to undriven lines within the circuit.

Although only one group of loopback traces (405, 407) is shown, loopback traces are used in each crossbar array layer to connect underutilized lines with undriven lines. The loopback traces (405, 407) can be formed in the same metal layer as the underutilized and undriven lines.

Note that no column lines emerge or are undriven at the north and south sides of the circuit of FIG. 4. This is because the row lines (215) are in a pillar configuration and do not travel through the circuit. Consequently, there is no need for loopback traces on the north and south sides of the circuit (400). However, memory circuits considered later have both row and column lines that travel.

Figure 5:
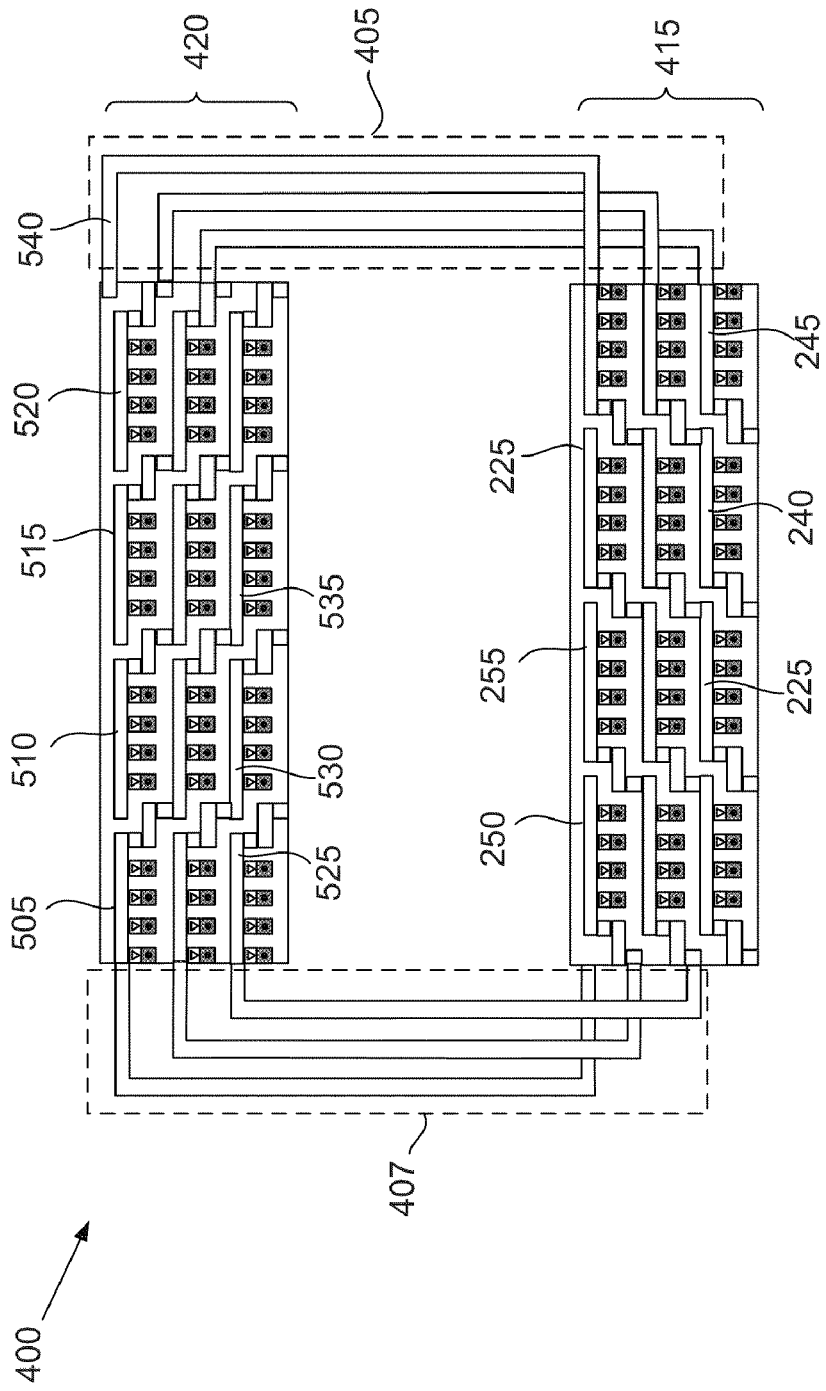
FIG. 5 is a diagram of an illustrative extensible three dimensional circuit in which emerging stubs are connected to undriven lines by loopback traces, according to one embodiment of principles described herein.

FIG. 5 is another diagram of the circuit (400) shown in FIG. 4. In this figure, a bottom portion of the diagram is a cross-section of the lines in the first bundle of traveling lines (415) and the top portion of the diagram is a cross-section of the lines in the second bundle of traveling lines (420). The loopback lines (405, 407) are shown connecting underutilized lines and undriven lines to create lines connected to a full complement of memristors. Specifically, the loopback traces (405) on the east connect underutilized lines (240, 245) in the first bundle of traveling lines (415) to undriven lines (515, 520) in the second bundle (420). Similarly, on the west side of the circuit (400) the loopback traces (407) connect underutilized lines (525, 530) in the second bundle (420) to undriven lines (250, 255) in the first bundle. Note that unlike in FIG. 4, the loopback lines (405, 407) are shown for all array layers of the circuit, although only one trace is shown for each bundle of column lines that emerge on a given array layer.

An additional line (540) is attached to a fully utilized line (225) in the first bundle (415). This additional line (540) terminates in the second bundle (420) without making any connections to an undriven line. This additional line (540) is included for symmetry and is optional. The additional line (540) does not have any significant detrimental effects on the circuit (500).

A number of alternative interconnection approaches are presented in the figures below. To facilitate this, a more abstract and less ornate depiction of the circuit is used. In this more abstract view, the invention memory circuit of FIGS. 4 and 5, if doubled in size to an 8×8 grid, would be depicted as in FIG. 6. Each gray square represents a mini-array where all row and column line bundles cross, forming memory elements. The dark arrowed lines show the traveling lines, where each step to the next gray square implies moving to the next higher memory array level. In general, the grid (605) can have any of a number of shapes including square, rectangular, hexagonal, or other shape. For square or rectangular grids, the size of the grid can be defined by two variables, N and M. The variable N is the number of mini-grids on a first side of the rectangle and the variable M is the number of mini-grids on another side of the rectangle. For a square, both sides of have the same number of mini-grids. Consequently, a square grid can be described as an N×N grid.

Figure 6:
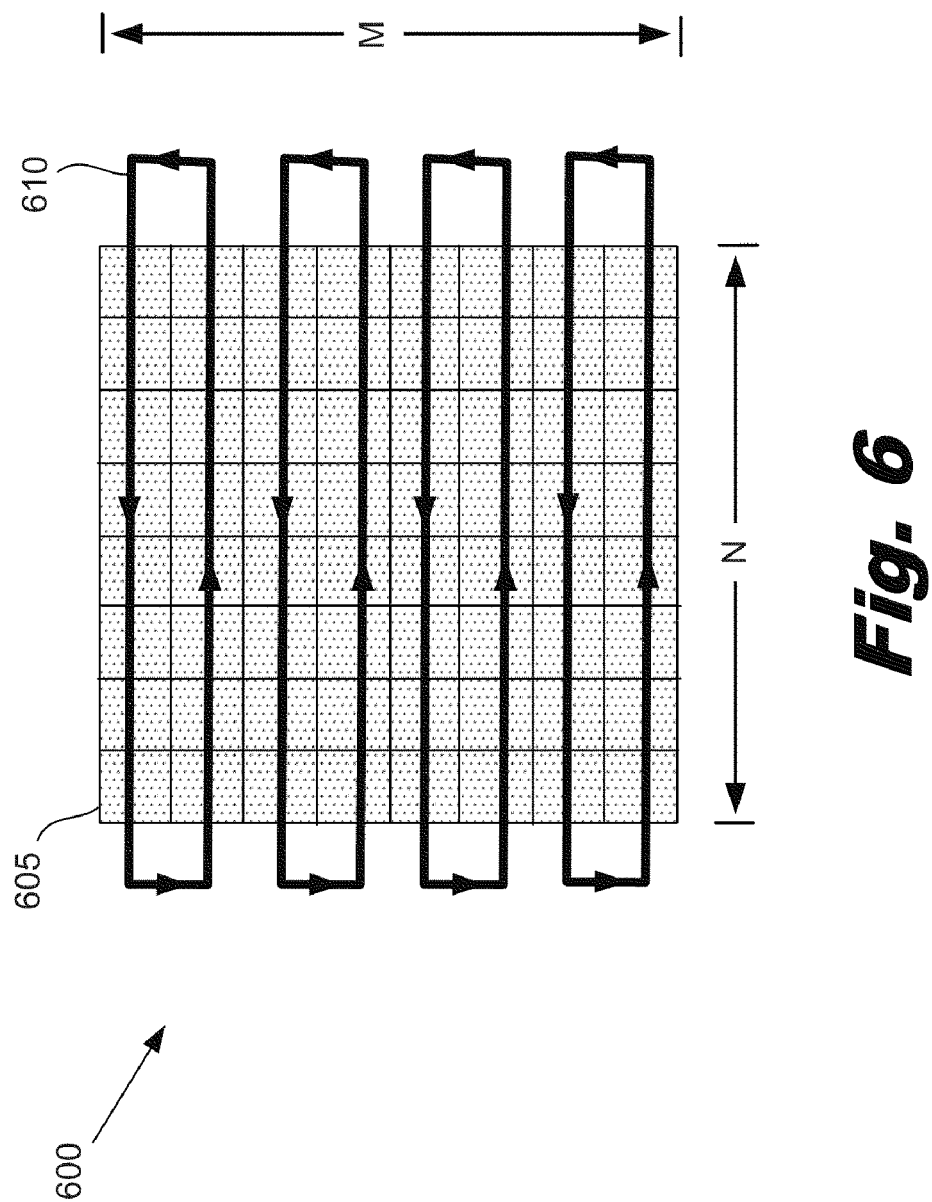
FIG. 6 is a cross sectional diagram of an illustrative extensible three dimensional circuit in which emerging stubs are connected to undriven lines by loopback traces, according to one embodiment of principles described herein.

FIG. 6 is a circuit (600) which has an interconnection scheme which is called "many loops" and has M/2 loops (610) for an N×M grid (605) of mini-arrays. Each loop is of length 2N, and after 2N layers, the traveling row line will be back over its original starting mini-array. The traveling line bundles share memory elements with 2N pillar line groups. Since in this design, the row vias are straight pillars that stay in their original starting grid, the memory elements present on the $(2N+1)^{st}$ layer would no longer be addressable with a unique row-line and column-line pair. In summary, the many-loop connection approach illustrated in FIG. 6 supports at most 2N layers.

Figure 7B:
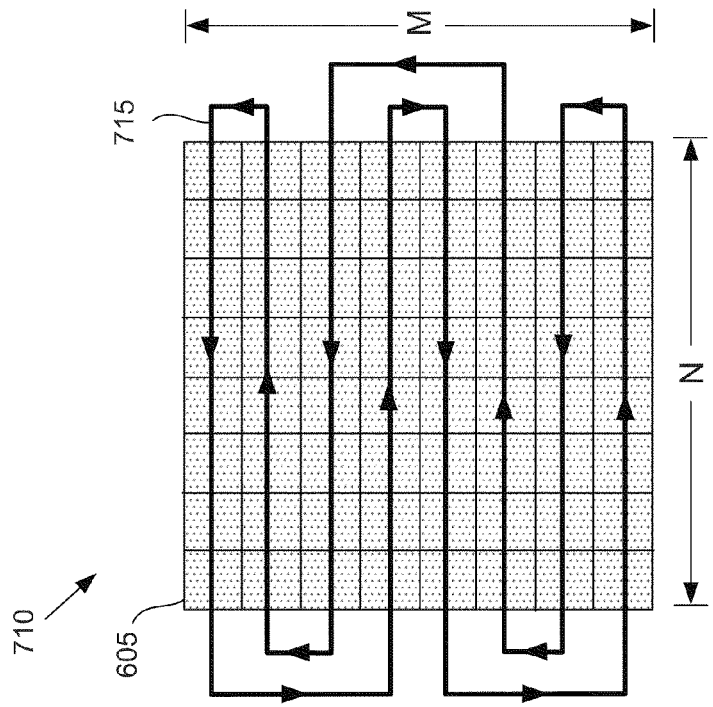
FIGS. 7A and 7B are diagrams of illustrative loopback connections in an extensible three dimensional circuit, according to one embodiment of principles described herein.
Figure 7A:
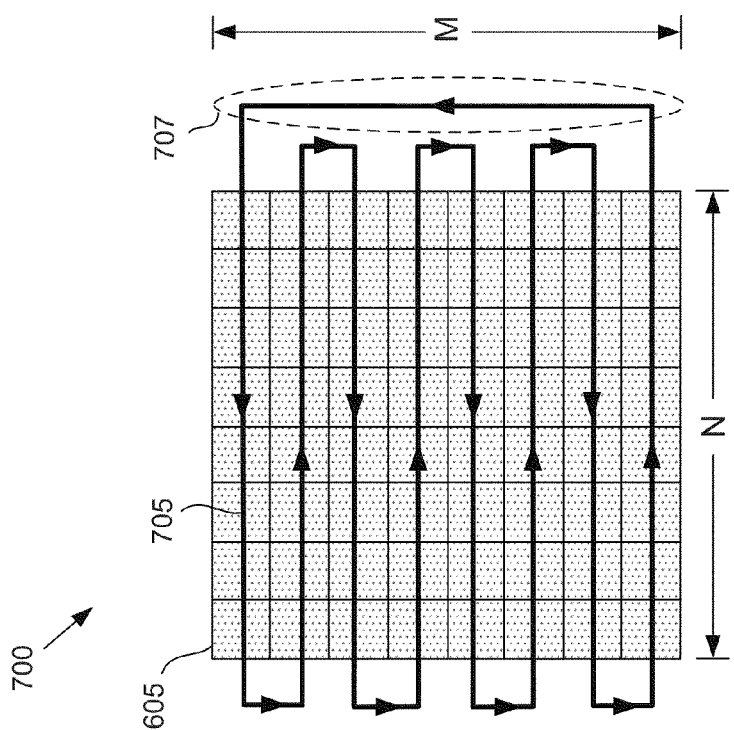

FIGS. 7A and 7B show two alternate invention loopback connection approaches are shown, both of which remove the 2N layer restriction of the "many loop" approach. FIG. 7A illustrates a circuit (700) which utilizes a "single loop" approach, where the traveling bundle of lines (705) clearly visits all of the N*M mini-arrays in the N×M grid (605) before returning to the original starting point. Thus, the "single loop" approach achieves the optimum maximum of N*M layers. However, the "single loop" approach incorporates a long "wrap back" line (707) which may create some interconnections which are significantly longer than others. This can lead to differences in the electrical characteristics between lines in the same circuit. For example, lines which are connected to shorter loopback connections may have a lower resistance and capacitance than lines which are connected to the long "wrap back" line (707). As discussed above, these differences may lower the overall performance of the circuit. For example, it may be necessary to make read times of memory elements in the circuit slower to allow lines with higher capacitance to be accurately read.

FIG. 7B is a circuit (710) which uses slightly more complex interconnection architecture called the "folded single loop," in which the traveling bundle of lines (715) snakes through the grid (605) and then returns by an adjacent path. This eliminates the long "wrap back" line and also achieves the N*M layer maximum. The "folded single loop" scheme may have a number of other advantages. For example, the "folded single loop" scheme may have more consistent line lengths where the number of layers is less than N*M, independent of the starting mini-array grid location of the traveling line. This can result in a more consistent travelling line length and more flexibility in designing circuits with less than N*M layers.

Figure 8:
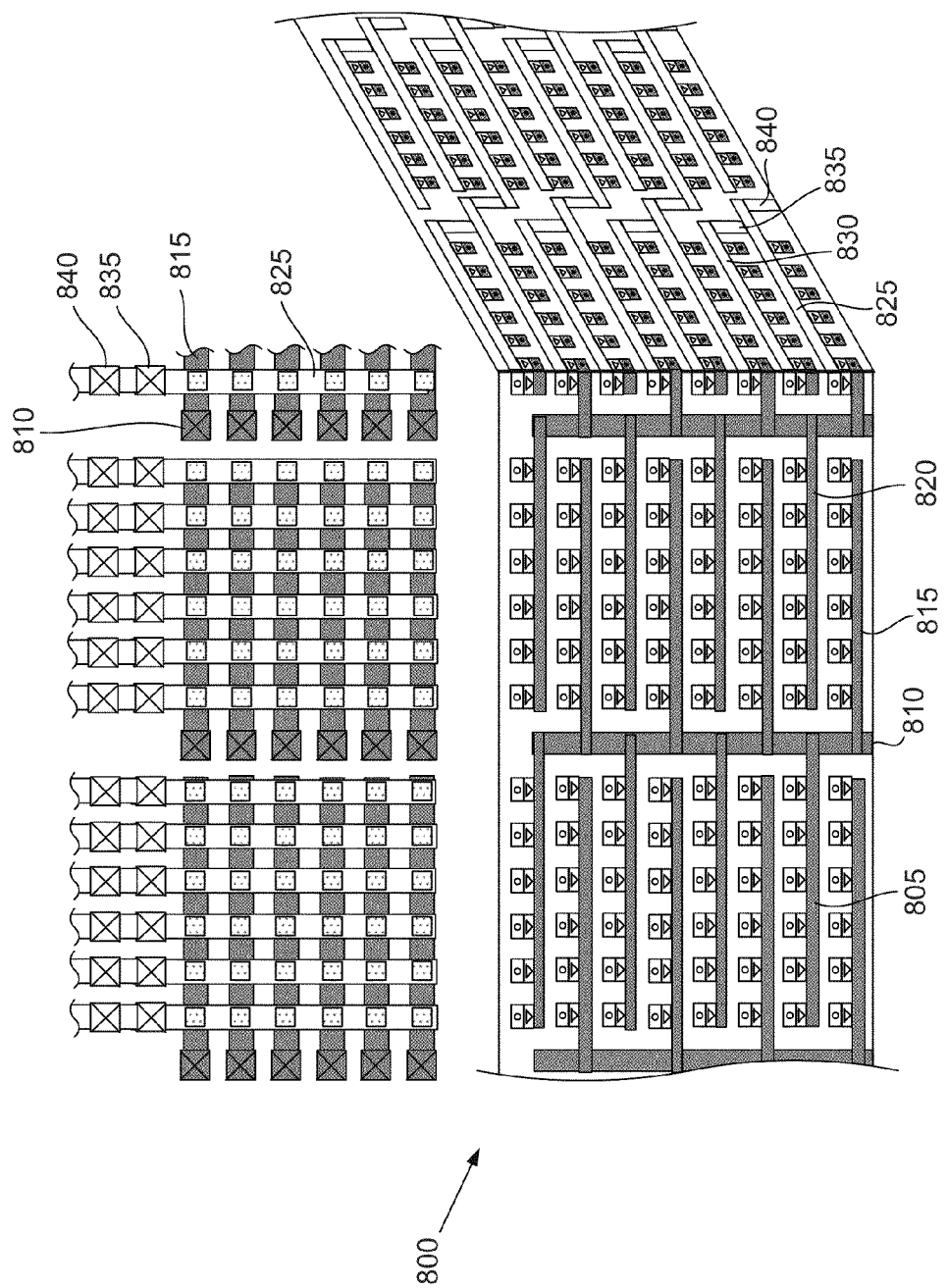
FIG. 8 is a diagram of illustrative extensible three dimensional circuit in which column lines pick up memory element connections with row lines on both sides, according to one embodiment of principles described herein.

FIG. 8 is a diagram of an illustrative extensible three dimensional circuit (800) with traveling column lines (825, 830) which interconnect with two different sets of pillar lines (815, 820) before making the next upward jog through the circuit (800). A major distinction of this illustrative design from previous embodiments is the row line handling. While the row via topology is still that of a pillar (810) with many short row lines (805, 815, 820), the row lines extend out alternately in both directions, rather than in one direction as in the circuit (200) of FIG. 2. The traveling column lines (825, 830) thus interconnect with two layers within any given mini-array before moving on to the next mini-grid footprint. For example, the traveling column lines split into an upper line (830) and a lower line (825). The upper column line (830) and lower column line (825) are connected by an interconnection via (835). In this illustrative embodiment, the upper column lines (830) share memory elements with row lines originating on the right and the lower column lines (825) share memory elements with row lines originating on the left before the column line jogs upward. Thus, the column line bundle cannot be looped back to a neighboring track without picking up duplicate memory element connections to the same row vias.

Figure 9:
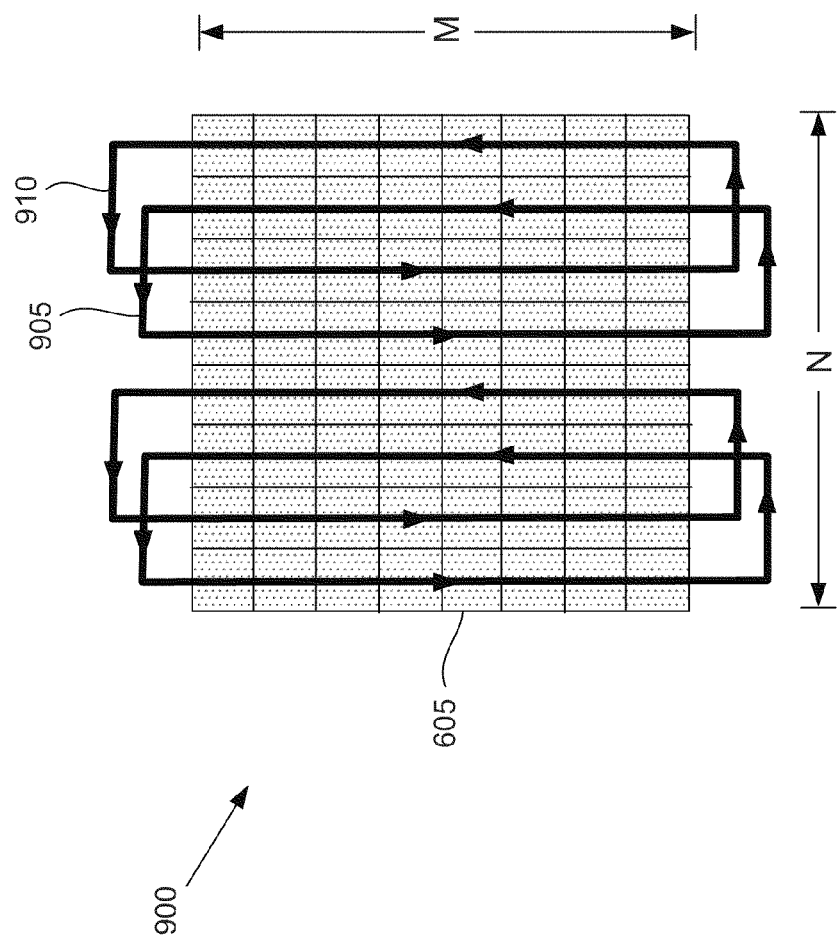
FIG. 9 is a diagram of illustrative an extensible three dimensional circuit with loopback connections which form many overlapping loops, according to one embodiment of principles described herein.

Because the column lines (825, 830) share memory elements with row lines from both sides of the track they are traveling along, the edge effect handling is slightly different. FIG. 9 shows one illustrative embodiment for handling edge loopback traces (905, 910) for the architecture described in FIG. 8. The routing formed by the loopback traces (905, 910) is shown on a shaded grid (605) which represents the multilayer circuit (900). As discussed above, each square in the grid represents a footprint of a mini-grid within the circuit. In this embodiment, the loopback traces (905, 910) form "double overlapping loops." The loopback traces (905, 910) connect a first bundle of traveling lines moving in a first direction to a nonadjacent bundle of traveling lines traveling in the opposite direction. This avoids reconnecting the traveling lines with pillar lines with which they have already interacted. In the example illustrated in FIG. 9, the traveling lines can move laterally and upward through the circuit for 2M grid locations before reencountering the same column lines. This "many overlapping loops" approach has an array layer count limit of 4M, which comes from a loop length of 2M×2 layers spent at each grid location.

Figure 10:
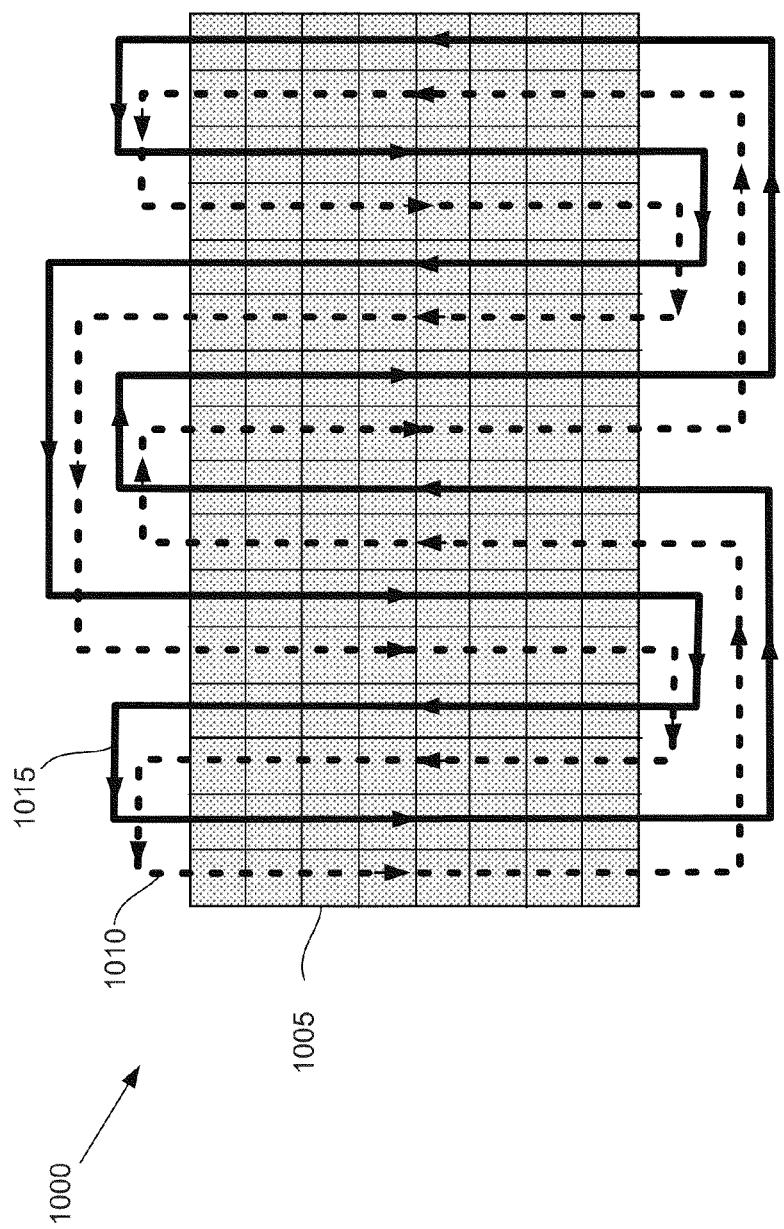
FIG. 10 is a diagram of illustrative an extensible three dimensional circuit with loopback connections which form a double overlapping folded loop, according to one embodiment of principles described herein.

While the loopback approach described in FIG. 9 can be sufficient for most practical choices of layer count, a loopback approach that achieves greater extensibility is shown in FIG. 10. FIG. 10 shows an extensible multilayer circuit (1000) which is represented by a 16×8 grid (1005) of mini-arrays. This wider grid (1005) allows the interconnection scheme to be more clearly shown and also demonstrates that the principles described can be applied to a wide variety of circuit footprints, including square and rectangular footprints. The loopback connections in this illustrative design form "double overlapping folded loops" (1010, 1015). Using the double overlapping folded loop design, each of the traveling lines can interact with each of the stationary pillar lines, thereby achieving maximum interconnectivity between the traveling lines and the stationary lines. This increases the length of the traveling lines, but allows for unique and complete addressability.

In this example, the step of reversing of direction of some of the traveling column lines has not been explicitly shown. However, the direction of traveling lines may be reversed in a manner which is similar to that shown in FIG. 4. However, in this illustrative example, the column line bundles to not travel in strictly alternate directions as shown in previous examples. Instead, two groups of column bundles travel in parallel and alternate directions every two rows. One principle which is the same in the various embodiments is that after the direction of the traveling lines is reversed, the number of underutilized lines which exit on a side are equal to the number of undriven lines on the same side of the circuit.

Figure 11:
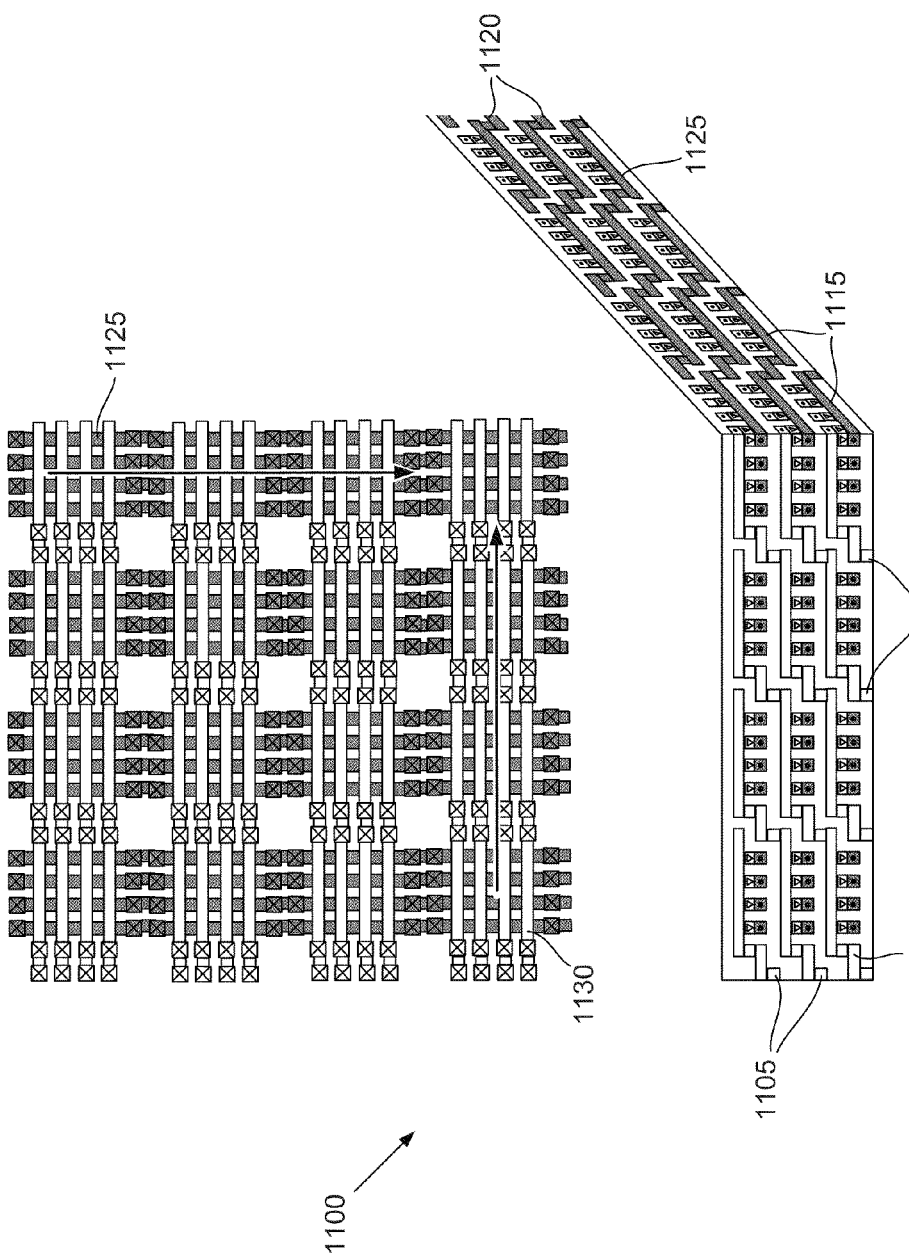
FIG. 11 is a diagram of illustrative an extensible three dimensional circuit in which both row and column lines travel, according to one embodiment of principles described herein.

FIG. 11 includes a plan view of a single array layer and a cross-sectional perspective view of an illustrative circuit (1110) in which both the row lines (1125) and the column lines (1130) travel. The row lines (1125) travel from north to south as indicated by the vertical arrow in the plan view of the circuit (1100). The column lines (1130) travel from east to west as indicated by the horizontal arrow in the plan view of the circuit (1100). This results in edge effects on all four sides of the circuit (1100). On the west side of the circuit (1100) there are undriven column lines (1105) and on the east side of the circuit (1100) there are underutilized column lines (1110). On the north side of the circuit (1100) there are undriven row lines (1120) and on the south side of the circuit (1100) there are underutilized row lines (1115).

To resolve these edge effects, the direction of travel of the row and column lines is first alternated. Next, loopback connections are made between the appropriate undriven and underutilized bundles of traveling lines to form lines with a full complement of memory elements. As discussed above, this resolves the issues of floating lines and addressing gaps.

Figure 12:
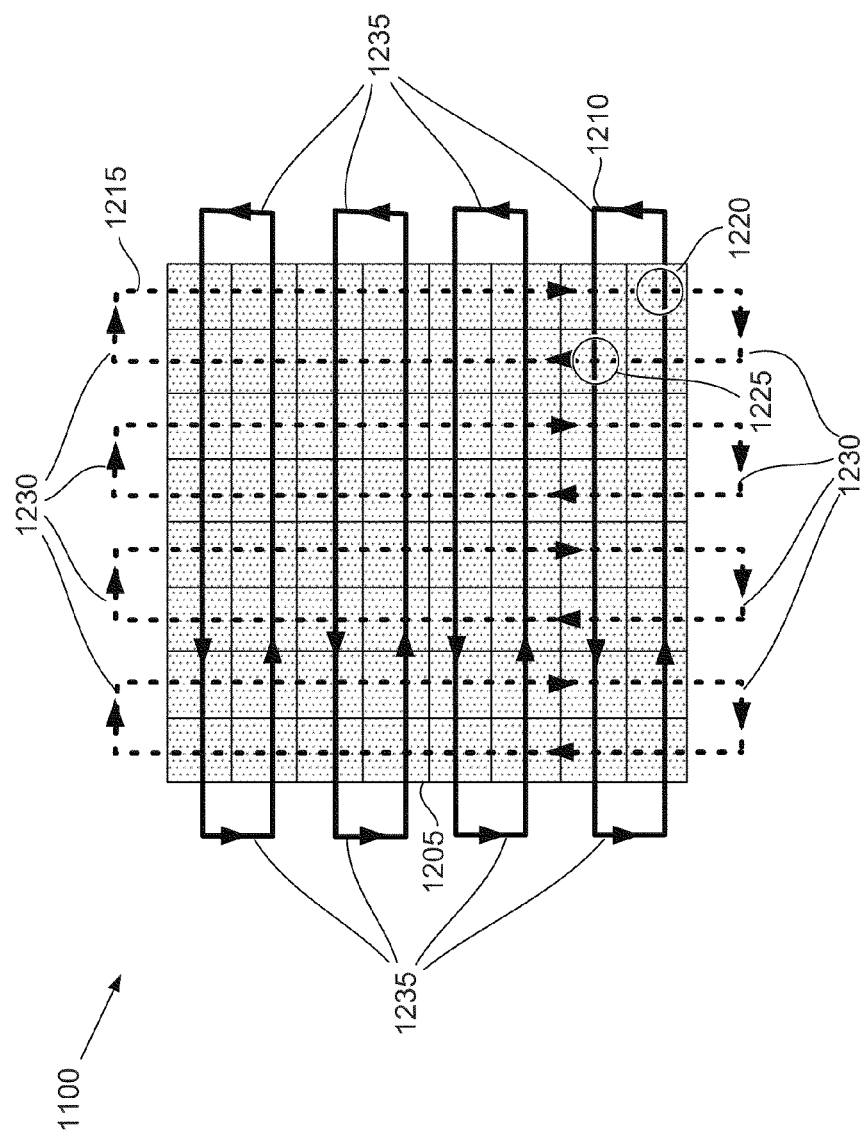
FIG. 12 is a diagram of a circuit in which traveling lines form redundant connections, according to one embodiment of principles described herein.

FIG. 12 is a diagram of illustrative loopback connections for an extensible three dimensional circuit (1200) in which both row and column lines travel as shown in FIG. 11, but with the direction of row and column line travel alternated as discussed above. As also discussed above, the footprint of the circuit and the tiled mini-arrays are shown as a grid (1205). The groups of traces which travel north and south are interconnected by a first group of loopback traces (1230). The lines which travel east and west are interconnected by a second group of loopback traces (1235). This connects the underutilized lines with undriven lines and completes the addressing space for the circuit.

However, this interconnection scheme may be less effective because redundant connections could be formed as traveling row lines interact with traveling column lines in a first square and then reencounter them in a different square. For example, a bundle of traveling row lines (1210) are represented by bottommost the solid black line. A bundle of traveling column lines (1215) is represented by the rightmost dashed line. If the traveling row lines (1210) cross the traveling column lines in the bottom right hand corner of the grid (indicated by the circled crossing point 1220), they will again cross after traveling two additional squares (indicated by the second circled crossing point 1225). Because the traveling row and column lines cross twice, they form redundant connections with memory elements. Consequently, the traveling row and column lines do not form unique addressing of the memory elements. The same combination of a row line and a column line would access two different memory elements, one at the first crossing point (1220) and one at the second crossing point (1225). To address this issue, several additional steps can be performed: First, analyzing the interconnection scheme to determine if redundant connections are formed, and second, altering the interconnection scheme to eliminate the redundant connections. The step of analyzing the interconnection scheme to determine if redundant connections are formed is illustrated above with respect to FIG. 12.

Figure 13:
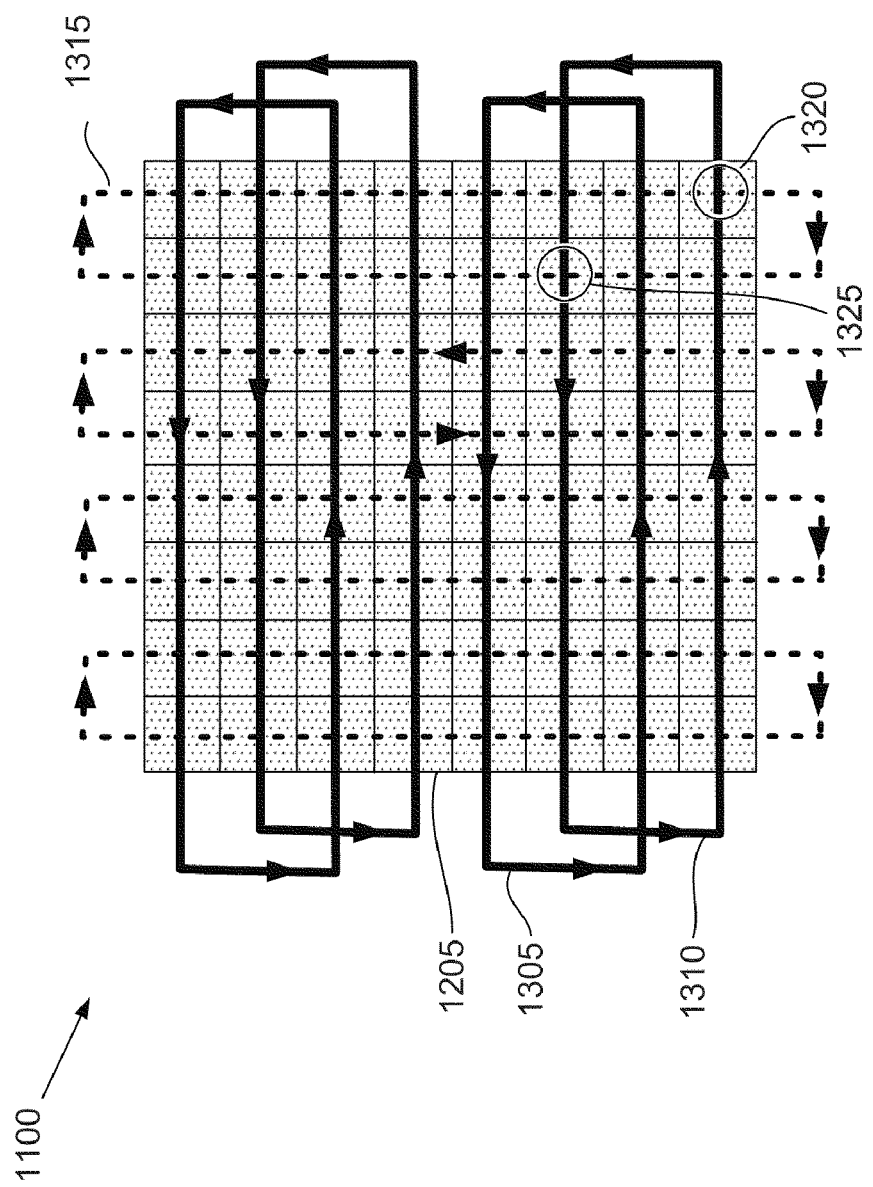
FIG. 13 is a diagram of an illustrative extensible circuit in which the interconnection scheme has been altered to eliminate redundant connections between traveling lines, according to one embodiment of principles described herein.

FIG. 13 describes the step of altering the interconnection scheme of the circuit (1100) to eliminate the redundant connections. As before, the circuit is shown as a grid (1205). In this illustrative embodiment, the traveling column lines (1315) are in the "many loops" configuration and the traveling row lines (1305, 1310) are in the "many overlapping loops" configuration. As described in FIG. 12, a first bundle of column lines (1315) crosses with a first bundle of row lines (1310) in the bottom right square (as indicated by the circle 1320). These same bundles of lines are in the same vertical footprint in a second square (indicated by the circle 1325). However, the bundle of column lines (1315) and the bundle of row lines (1310) are at different vertical locations within the footprint and consequently do not form redundant connections.

Specifically, at the first crossing point (1320), the column lines (1315) and the row lines (1310) are at the same level and in the same footprint. Consequently, they interact to address a number of memory elements. With each step to another footprint (indicated by the travel of a bundle of lines into another square), the bundles of lines move vertically upward. Specifically, as the column lines (1315) exit the crossing point (1320), the column lines are looped back into the circuit (1100). The column lines (1315) encounter a second square and move upward one level. The column lines (1315) move upward two more levels before entering the footprint with the second crossing point (1325). Consequently, the column lines (1315) are three levels higher in the second crossing point (1325). In contrast, the row lines (1310) only move two levels higher before encountering the second intersection (1325). Because the column lines (1315) are in the crossbar array above the row lines (1310) in the second intersection, these particular row and column lines do not interact and do not form redundant connections. By altering the interconnection scheme, the row and column lines (1310, 1315) are out of step at the second interconnection and do not interact for a second time.

Figure 14:
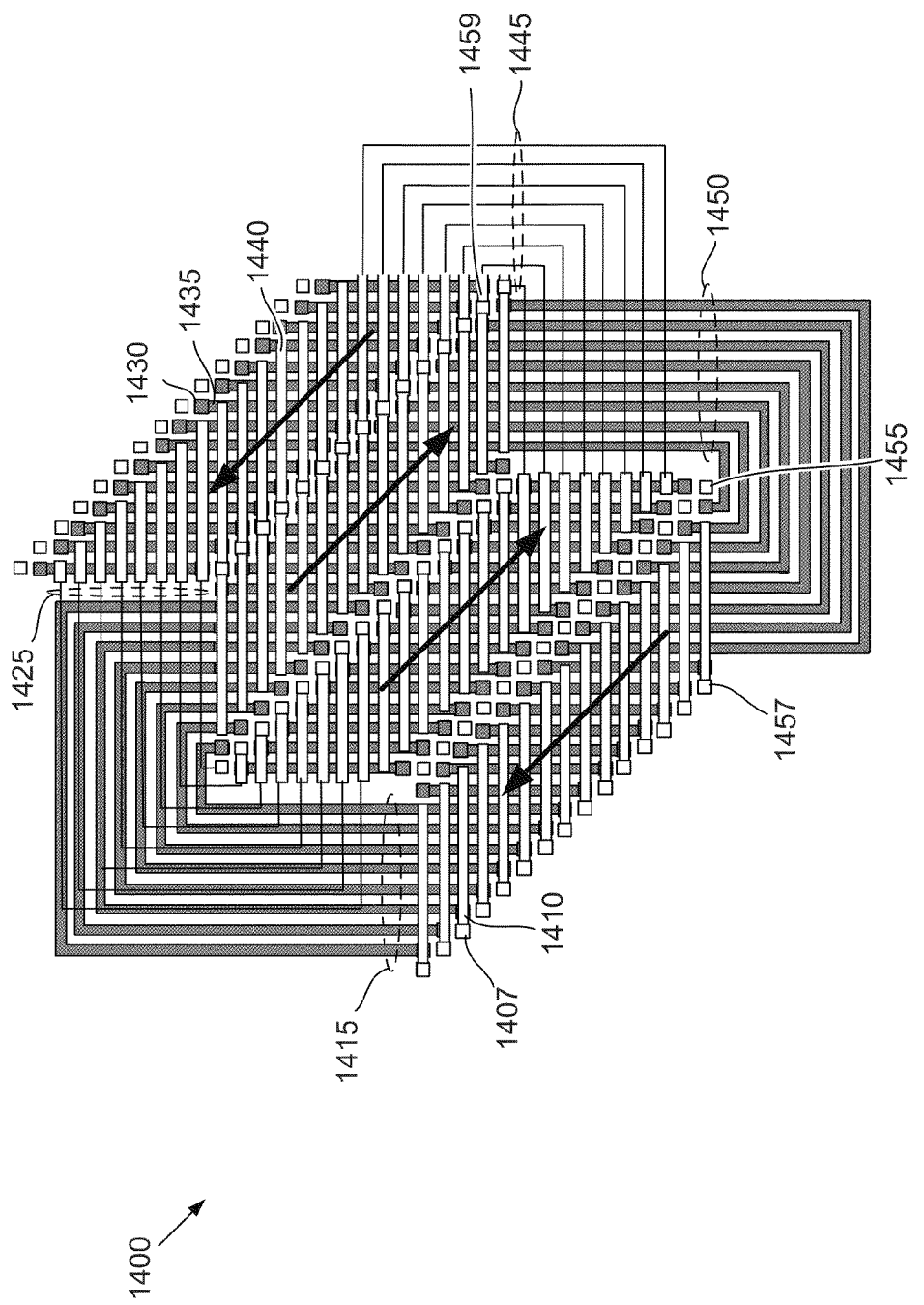
FIG. 14 is a diagram of illustrative overlapping loopback connections for an odd-numbered crossbar array layer of an extensible three dimensional circuit having parallel channels, according to one embodiment of principles described herein.

FIG. 14 provides another example of the method for resolving edge effects with a circuit (1400). As discussed above, one principle of handling edge effects is for traveling lines to go in both directions in equal numbers, so that the number of undriven lines that need to be sourced into a given side of the circuit equals the number of traveling lines that emerge from that side. For clarity, FIG. 14 shows only a first crossbar array layer in the circuit (1400). The circuit (1400) has alternating directions of row line travel along the parallel channels and utilizes loop back traces (1415, 1425, 1450, 1445) at the periphery of the circuit. This resolves the edge effects created by the termination of the row and column lines (1410, 1435) at the periphery of the circuit by looping the row and column lines back into the circuit (1400). To effectively loop the lines back into the circuit (1400), the direction of travel within the parallel channels alternates. Arrows show the direction of row line travel in each of the four parallel channels. For purposes of description, the left most of the four parallel channels will be referred to as the first channel, the second from the left as the second channel and so forth.

In the first channel, the direction of travel of the column lines (1435) is on alternate layers first upward and then toward the left. In this channel, there are a number of underutilized column lines on its upper edge. Loopback traces (1415) connect these underutilized column lines to otherwise undriven column lines in the third parallel channel. At the bottom edge of the first channel there a number of undriven column lines which are connected to underutilized column lines at the bottom of the third channel by loop back traces (1450).

In the second channel, the direction of travel of the column lines is on alternate layers first downward and then to the right. In this channel, there are a number of underutilized row lines that emerge from the circuit (1400) on its upper edge. Loopback traces (1425) connect these underutilized row lines to undriven row lines in the fourth parallel channel. At the bottom edge of the second channel there a number of undriven row lines which are connected to underutilized row lines at the bottom of the fourth channel by loop back traces (1445). Combining the underutilized lines with the undriven lines forms lines with a full complement of crosspoint devices for each row and column line. This resolves a number of issues, including eliminating gaps in the addressing scheme which are not useable and eliminating floating lines which may interfere with the operation of the circuit (1400).

In the array layer of FIG. 14, the row lines (1410) extend east and west from row vias (1407) to cross column lines (1435) which extend north and south from column vias (1430). As shown in FIG. 14, a line of row vias (1455) between the first and second channels does not have any attached row lines in this layer. Other lines of row vias (1457) have row lines which extend in only one direction. Yet another line of row vias (1459) have row lines which extend in both directions. As each line of row vias (1455, 1457, 1459) pass upward through the circuit, the configurations of row lines which attach to the row vias may change in each layer. For example, the line of row vias (1457) between the first and second parallel rows may have no row lines attached in the first layer, yet row lines which extend in two directions in the second layer.

Rather than form loopback connections to adjacent channels, the interconnection architecture has been altered to insure that loopback connections make additional unique connections rather than redundant connections. First, the loopback connections are not made to the nearest channel, since the traveling column lines have already created memory element connections to the row vias on both sides of the channel. By looping back to the nearest channel, memory elements with non-unique row and column line connections would be created. Consequently, the loopback connections are made to a nonadjacent channel so that additional unique connections are formed.

The loopback traces (1415, 1425, 1445, 1455) are each formed in a single metal layer. For example, loopback traces (1415, 1450) which connect the column lines (1435) are formed in the same metal layer as the column lines and loopback traces (1425, 1445) which connect the row lines (1410) are formed in the same metal layer as the row lines. The metal layers which contain the column loopback traces (1415, 1450) and the metal layers which contain the row loopback traces (1425, 1445) are separated by an insulating layer which can contain, where selectively desired, the programmable crosspoint devices. For purposes of illustration, this insulating layer has been illustrated as being transparent. Consequently, even though the loopback traces (1415, 1425, 1445, 1455) overlap each other, they do not make electrical contact because they are separated by the insulating layer. Further, no memristive connections are formed between the overlapping loopback lines, since their creation in these locations disrupts the regular addressability of the array and so has been omitted. Relatively thick lines are used to illustrate loopback traces (1415, 1450) which are associated with column lines (1435) and thin lines are used to illustrate loopback traces (1425, 1445) associated with the row lines (1410). However, this is for purposes of illustration. In practice, the loopback traces (1415, 1425, 1445, 1450) may have comparable widths.

Figure 15:
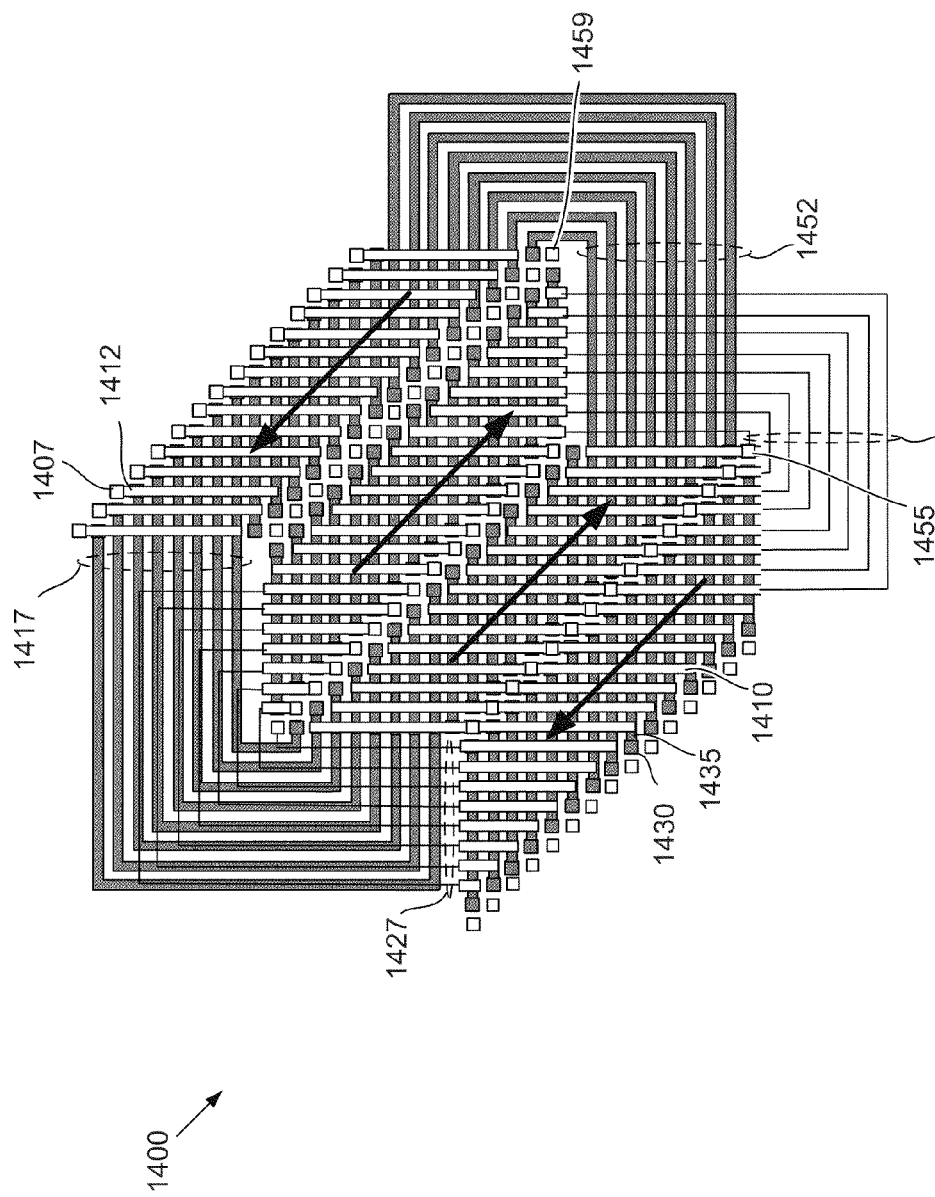
FIG. 15 is a diagram of illustrative overlapping loopback connections for an even-numbered crossbar array layer of an extensible three dimensional circuit having parallel channels, according to one embodiment of principles described herein.

FIG. 15 shows a second crossbar array layer within the circuit (1400). The second crossbar array overlays the first crossbar array layer illustrated in FIG. 14 and has the same parallel channel configuration. In the second crossbar array layer, the row lines (1410) travel north/south and the column lines (1435) travel east/west, which is opposite that shown in the first layer illustrated in FIG. 14. However, the overall motion of the traveling column lines (1435) remains the same in each parallel channel throughout the circuit. This is illustrated by the arrows in each parallel channel.

As discussed above, loop back traces (1417, 1427, 1452, 1447) can be used at the periphery of the circuit to connect undriven lines to emerging underutilized lines. This resolves the edge effect created by the termination of the column and row lines at the periphery of the circuit by looping the row and column lines back into the circuit (1400). In the first channel, the column lines (1437) extend to the west and terminate on this layer at the column vias (1430) that connect the column lines (1437) to the overlying array layer. In the crossbar array layer of FIG. 15, row lines (1442) extend both north and south from the line of row vias (1455) between the first and second channels. The row vias (1459) between the third and fourth channels do not have any row lines attached. The uppermost line of row vias (1407) has row lines (1412) which extend southward. The crossbar array patterning and loopback connections illustrated in FIGS. 14 and 15 repeat every two layers.

FIG. 16 is a flowchart (1600) of an illustrative method for peripheral signal handling in an extensible three dimensional circuit. In a first step, an extensible three dimensional circuit is formed with at least one class of traveling lines (step 1610). This class of traveling lines may be row lines, column lines, or some portion of lines within a circuit. The traveling lines are divided into bundles of lines which move vertically and laterally through the circuit. The traveling direction of bundles of traveling lines is alternated such that there are a substantially equal number of undriven lines and underutilized lines which exit out of a given side of the circuit (step 1620). Loopback traces are created which connect the undriven lines and the underutilized lines to form driven lines with a full complement of memory elements and eliminate addressing gaps within the circuit (step 1630). At this point, the circuit may be analyzed to determine if redundant addressing of memory elements occurs (step 1640). If redundant interconnections occur, the interconnection scheme is altered so that the row and column lines are in different vertical separate crossbar arrays when the row and column lines cross for a second time (step 1650). This may be done in a variety of ways, include altering the length or direction of the path of one of the traveling bundles.

In sum, the advantages of the peripheral signal handling methods and embodiment described above clearly relate back to the edge effect issues that are solved. The costs of implementing the peripheral signal handling are minimal; only a small amount of peripheral area on each memory array layer of the three dimensional memory circuit is used. Not handling these edge effects otherwise has an area penalty that grows with the square of the number of array layers. The illustrative method described above provides the tools to create a regularly addressable memory array, not one that is carved out of the central area of a larger array. Further, it cleanly handles undriven row or column lines, which eliminates floating lines and addressing gaps.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A method for handling peripheral signals in an extensible three dimensional circuit comprises:
    forming an extensible three dimensional circuit with a plurality of stacked crossbar array layers and at least one class of traveling lines which travel vertically and laterally through the circuit;
    alternating the traveling direction of bundles of traveling lines such that there are a substantially equal number of undriven lines and underutilized lines which exit out of a given side of the circuit; and
    creating loopback traces which connect the undriven traveling lines and the underutilized traveling lines to form driven traveling lines with a full complement of memory elements and eliminate addressing gaps within the circuit.

2. The method of claim 1, in which creating loopback traces further comprises connecting a first bundle of traveling lines moving in a first direction to a second bundle of traveling lines moving in an opposite direction.

3. The method of claim 1, in which creating loopback traces comprises forming loopback traces on at least two peripheral sides of the circuit, the loopback traces being formed in the same metal layer as the traveling lines.

4. The method of claim 1, in which the loopback traces which connect undriven traveling lines with underutilized traveling lines are substantially identical for all crossbar arrays.

5. The method of claim 1, in which pillar lines form parallel channels through the circuit, the traveling lines in adjacent crossbar layers moving in orthogonal directions such that a traveling line moves in a path which zigzags through a parallel channel and moves upward through the circuit.

6. The method of claim 5, in which creating loopback traces comprises forming loopback traces which connect underutilized pillar lines to undriven pillar lines; the loopback traces being formed in the same metal layer as the pillar lines.

7. The method of claim 1, further comprising forming an extensible three dimensional circuit with two classes of traveling lines, the two classes of traveling lines comprising traveling row lines and traveling column lines.

8. The method of claim 7, in which creating loopback traces further comprises forming loopback traces for each of the two classes of traveling lines.

9. The method of claim 1, further comprising:
    analyzing the extensible three dimensional circuit to determine if redundant addressing of memory elements occurs; and
    if redundant addressing of memory elements occurs, altering an interconnection scheme so that the traveling row lines and the traveling column lines are in vertically separate crossbar arrays when the traveling row lines and traveling column lines cross for a second time.

10. The method of claim 9, in which altering the interconnection scheme comprises modifying a travel direction and topology of the interconnection scheme to differentiate the length of the path taken between a first and second crossing of traveling row and column lines.

11. The method of claim 1, in which the extensible three dimensional circuit comprises a class of pillar lines and a class of traveling lines, the pillar lines in a given crossbar array extending laterally outward in two opposing directions from a pillar via.

12. The method of claim 11, in which creating loopback traces comprises connecting underutilized traveling lines to undriven traveling lines in a nonadjacent parallel channel.

13. The method of claim 12, in which loopback traces connected to a first bundle of underutilized traveling lines cross over loopback traces connected to a second bundle of underutilized traces without electrical contact between the loopback traces.

14. The method of claim 1, in which each crossbar array in the extensible three dimensional circuit comprises a number of tiled mini-arrays, the circuit having N mini-arrays along one side and M mini-arrays along a second orthogonal side; the extensible three dimensional circuit further comprising an interconnection scheme which provides unique addressing through at least 2N stacked crossbar arrays.

15. The method of claim 14, in which the interconnection scheme provides unique addressing for up to M*N stacked crossbar arrays.

* * * * *